US012765269B2

(12) United States Patent
Ikegawa et al.

(10) Patent No.: US 12,765,269 B2
(45) Date of Patent: Oct. 13, 2026

(54) MAGNETORESISTIVE DEVICES AND METHODS THEREFOR

(71) Applicant: Everspin Technologies, Inc., Chandler, AZ (US)

(72) Inventors: Sumio Ikegawa, Phoenix, AZ (US); Jijun Sun, Chandler, AZ (US); Monika Arora, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 858 days.

(21) Appl. No.: 17/670,049

(22) Filed: Feb. 11, 2022

(65) Prior Publication Data

US 2023/0263071 A1 Aug. 17, 2023

(51) Int. Cl.

| | |
|---|---|
| ***H10N 50/80*** | (2023.01) |
| ***H10B 61/00*** | (2023.01) |
| ***H10N 50/01*** | (2023.01) |
| ***H10N 50/85*** | (2023.01) |

(52) U.S. Cl.

CPC ............. *H10N 50/80* (2023.02); *H10B 61/22* (2023.02); *H10N 50/01* (2023.02); *H10N 50/85* (2023.02)

(58) Field of Classification Search

CPC ................................ H10B 61/22; H10N 50/80

See application file for complete search history.

(56) References Cited

U.S. PATENT DOCUMENTS

| | | | | |
|---|---|---|---|---|
| 2005/0226041 | A1 | 10/2005 | Nejad et al. | |
| 2013/0175646 | A1 | 7/2013 | Kim et al. | |
| 2019/0013460 | A1 * | 1/2019 | Ikegawa | H01F 10/3286 |
| 2020/0006625 | A1 * | 1/2020 | Oguz | H01F 10/329 |
| 2020/0044142 | A1 | 2/2020 | Honjo et al. | |
| 2023/0059590 | A1 * | 2/2023 | Kim | H10B 61/22 |

FOREIGN PATENT DOCUMENTS

| | | |
|---|---|---|
| TW | 200625305 A | 7/2006 |
| TW | 201724370 A | 7/2017 |

OTHER PUBLICATIONS

W. H. Butler, et al., "Switching Distributions for Perpendicular Spin-Torque Devices Within the Macrospin Approximation," IEEE Transactions on Magnetics, vol. 48, No. 12 (Dec. 2012).

* cited by examiner

*Primary Examiner* — Douglas M Menz

(74) *Attorney, Agent, or Firm* — Bookoff McAndrews, PLLC

(57) ABSTRACT

A magnetoresistive stack may include a first electrically conductive material, a fixed region having a fixed magnetic state, a free region configured to have a first magnetic state and a second magnetic state, a dielectric layer disposed between the fixed region and the free region, a spacer region, and a cap layer disposed between the spacer region and the free region. The free region may include a layer of ferro-magnetic material, an insertion layer, an iPMA layer, and/or a low saturation magnetization layer.

20 Claims, 11 Drawing Sheets

MAGNETORESISTIVE DEVICES AND METHODS THEREFOR

TECHNICAL FIELD

The present disclosure relates to magnetoresistive stacks and methods of manufacturing magnetoresistive stacks.

INTRODUCTION

There are many inventions described and illustrated herein, as well as many aspects and embodiments of those inventions. In one aspect, the present disclosure relates to magnetoresistive structures (for example, part of a magnetoresistive memory device, magnetoresistive sensor/transducer device, etc.) and methods of manufacturing the described magnetoresistive structures. For example, the disclosed structures may be related to magnetoresistive random access memory (MRAM) devices, magnetoresistive sensor/transducer devices, etc. To describe aspects of the disclosed devices and methods, exemplary magnetoresistive stack configurations are described. However, these are only exemplary. The disclosed devices can have many other stack configurations, and the disclosed methods can be applied to manufacture magnetoresistive devices having various suitable magnetoresistive stacks.

Briefly, a magnetoresistive stack used in a memory device (e.g., an MRAM device) includes at least one non-magnetic layer (for example, at least one dielectric layer or a non-magnetic yet electrically conductive layer) disposed between a fixed magnetic region (e.g., a fixed region) and a free magnetic region (e.g., a free region), each including one or more layers of ferromagnetic materials. Information may be stored in the magnetoresistive stack by switching, programming, and/or controlling the direction of magnetization vectors in the magnetic layer(s) of the free region. The direction of the magnetization vectors of the free region may be switched and/or programmed (for example, through spin transfer torque (STT)) by application of a write signal (e.g., one or more current pulses) adjacent to, or through, the magnetoresistive memory stack. In contrast, the magnetization vectors in the magnetic layers of a fixed region are magnetically fixed in a predetermined direction. When the magnetization vectors of the free region adjacent to the non-magnetic layer are in the same direction as the magnetization vectors of the fixed region adjacent to the non-magnetic layer, the magnetoresistive memory stack has a first magnetic state. Conversely, when the magnetization vectors of the free region adjacent to the non-magnetic layer are opposite the direction of the magnetization vectors of the fixed region adjacent to the non-magnetic layer, the magnetoresistive memory stack has a second magnetic state. Together, the magnetic regions on either side of the non-magnetic layer form a magnetic tunnel junction (MTJ) when the non-magnetic layer is a dielectric material. The MTJ has different electrical resistances in the first and second magnetic states. For example, a resistance of the second magnetic state may be relatively higher than a resistance of the first magnetic state. The magnetic state of the magnetoresistive memory stack is determined or read based on the resistance of the stack in response to a read current applied, for example, through the magnetoresistive stack.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well-defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more “rounded” and/or gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as “exemplary” is not to be construed as preferred or advantageous, for example, over other embodiments or implementations; rather, it is intended to reflect or indicate that the embodiment(s) is/are “example” embodiment(s). Further, even though the figures and this written disclosure appear to describe the magnetoresistive stacks of the disclosed magnetoresistive devices in a particular order of construction (e.g., from bottom to top), it is understood that the depicted magnetoresistive stacks may have a different order (e.g., the opposite order (i.e., from top to bottom)).

Figure 1:
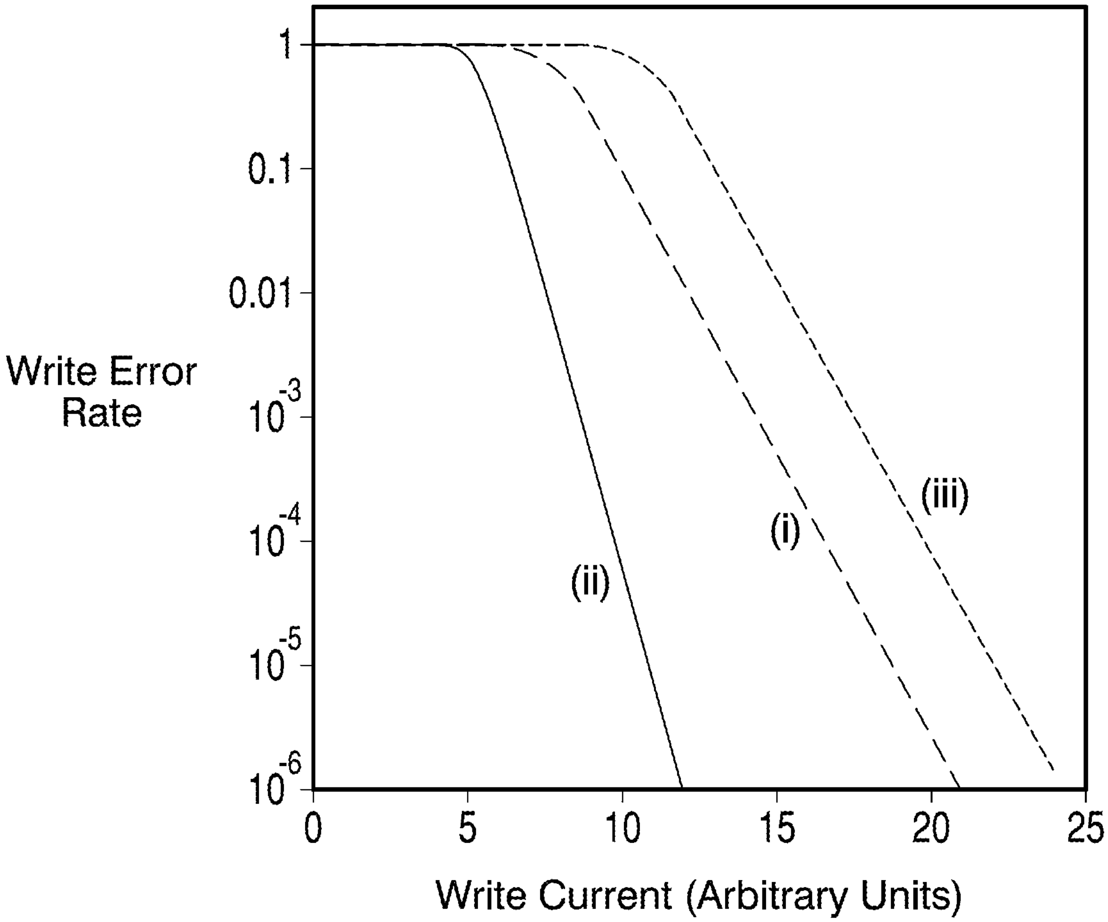
Figure 2:
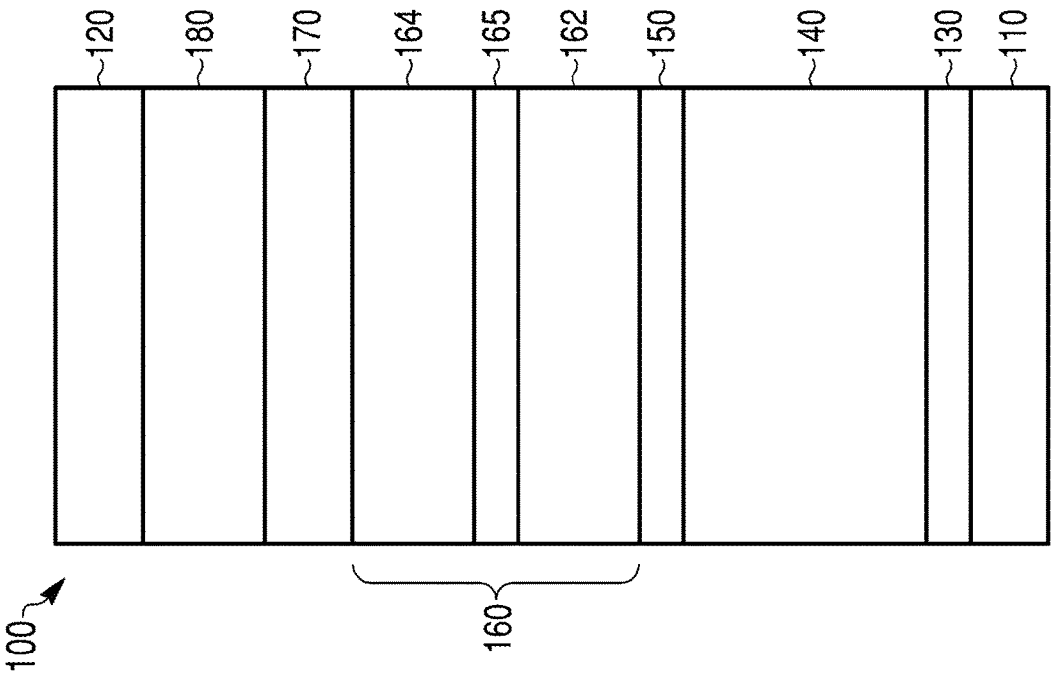
Figure 10:
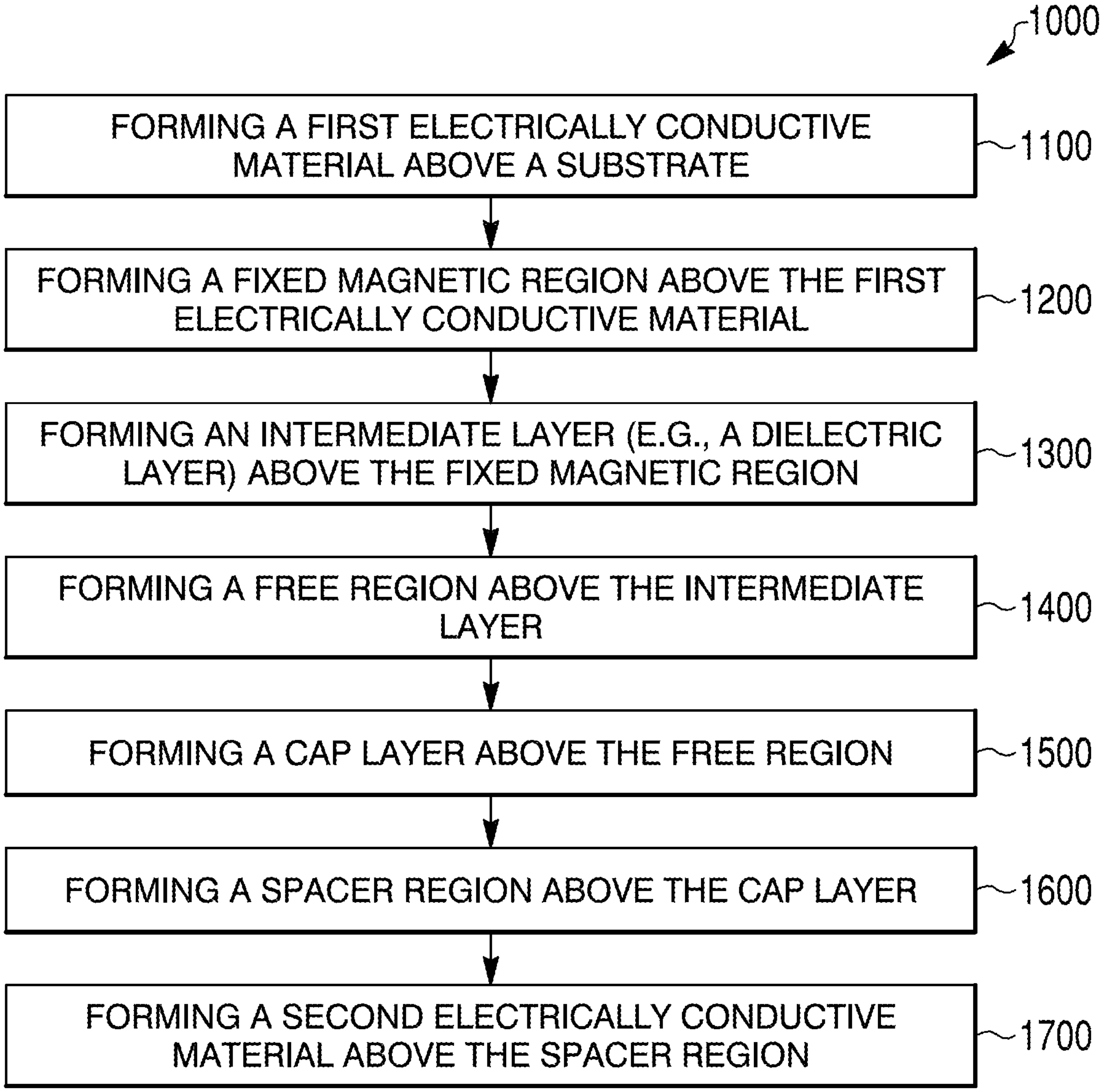
Figure 16:
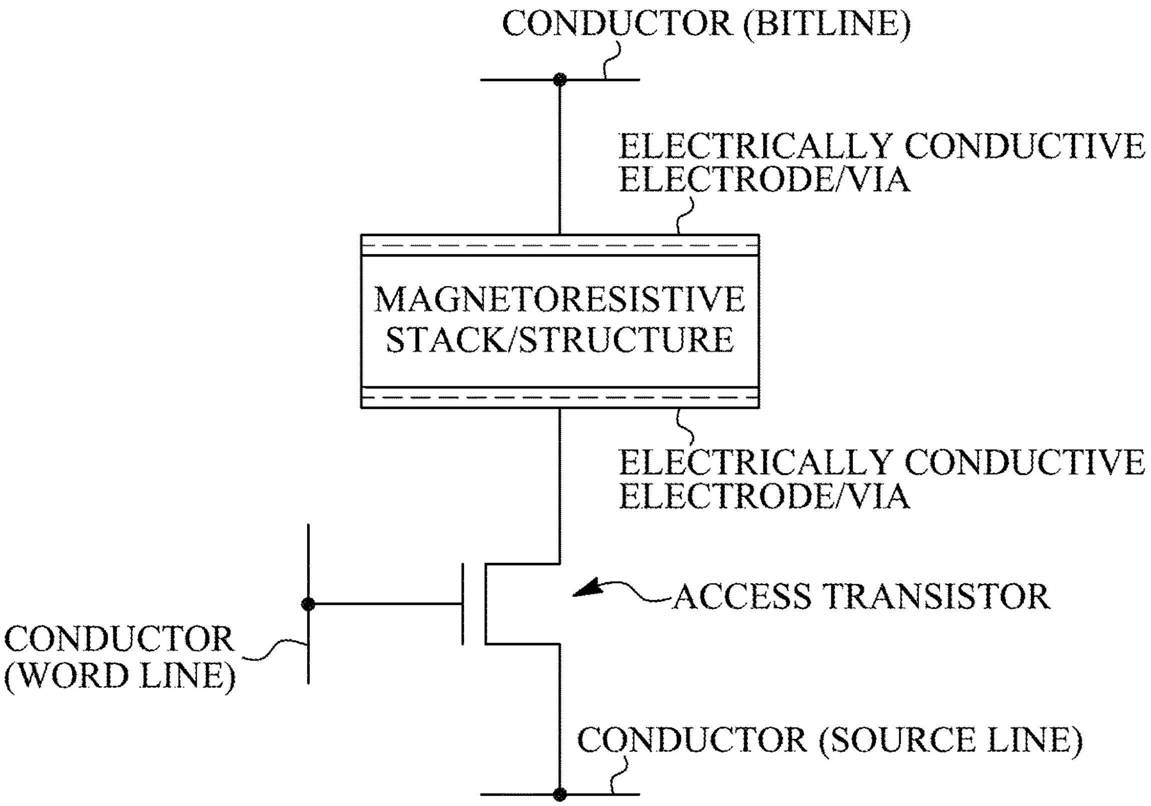
Figure 17A:
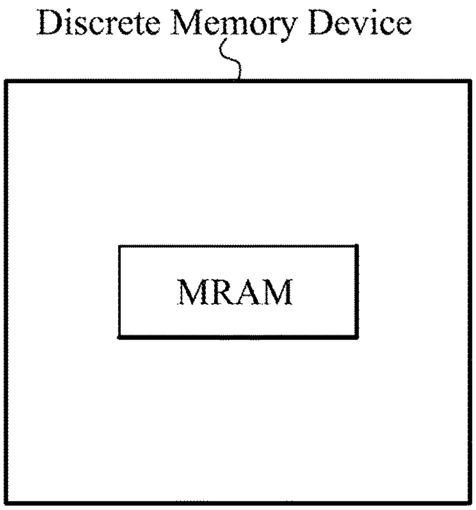
Figure 17B:
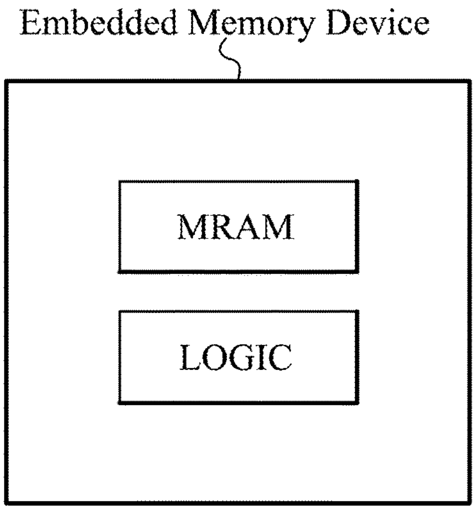

FIG. 1 is a graph showing the relationship between write error rate and write current for magnetoresistive stacks including various free region compositions, according to one or more embodiments of the present disclosure;

FIG. 2 illustrates a cross-sectional view depicting various regions of an exemplary magnetoresistive stack, according to one or more embodiments of the present disclosure;

FIGS. 3-9 illustrate cross-sectional views depicting various regions of exemplary magnetoresistive stacks, according to one or more embodiments of the present disclosure;

FIG. 10 is a flow chart illustrating an exemplary fabrication process for manufacturing a magnetoresistive structure, according to one or more embodiments of the present disclosure;

FIGS. 11-15 are flow charts illustrating exemplary fabrication processes for forming a region of a magnetoresistive structure, according to one or more embodiments of the present disclosure;

FIG. 16 is a schematic diagram of an exemplary magnetoresistive memory stack electrically connected to a select device, e.g., an access transistor, in a magnetoresistive memory cell configuration, according to aspects of certain embodiments of the present disclosure; and FIGS. 17A and 17B are schematic block diagrams of integrated circuits including a discrete memory device and an embedded memory device, each including MRAM (which, in one embodiment is representative of one or more arrays of MRAM having a plurality of magnetoresistive memory stacks, according to aspects of certain embodiments of the present disclosure).

Again, there are many embodiments described and illustrated herein. The present disclosure is not limited to any single aspect or embodiment thereof, nor is it limited to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

The present disclosure generally relates to magnetoresistive devices having a magnetoresistive stack or structure (for example, part of a magnetoresistive memory device, magnetoresistive sensor/transducer device, etc.) and methods of manufacturing the described magnetoresistive devices. For example, present embodiments describe magnetoresistive stacks including a free region designed to improve high-speed writing performance (for example, by decreasing damping forces and/or improving switching efficiency), and methods of manufacturing the magnetoresistive stacks.

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+01t) units. Further, all relative terms such as "about," "substantially," "approximately," etc. are used to indicate a possible variation of ±10% (unless noted otherwise or another variation is specified). Moreover, in the claims, values, limits, and/or ranges of thickness and atomic composition of, for example, the described layers/regions, mean the value, limit, and/or range ±10%. It should be noted that the exemplary thickness values discussed in this disclosure are expected values (i.e., not measured values) of layer thicknesses immediately after deposition (based on deposition conditions, etc.). As a person of ordinary skill in the art would recognize, these as-deposited thickness values of a layer or region may change (e.g., by inter-layer diffusion, etc.) after further processing (e.g., exposure to high temperatures, etc.).

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device or method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

It should further be noted that, although exemplary embodiments are described in the context of MTJ stacks/structures, the present inventions may also be implemented in connection with giant magnetoresistive (GMR) stacks/structures where a conductor (e.g., a layer of copper) is disposed between two ferromagnetic regions/layers/materials. Embodiments of the present disclosure may be employed in connection with other types of magnetoresistive stacks/structures where such stacks/structures include a free region. For the sake of brevity, the discussions and illustrations presented in this disclosure will not be repeated specifically in the context of GMR or other magnetoresistive stacks/structures (e.g., anisotropic magnetoresistive (AMR) devices), but the discussion and drawings described below are to be interpreted as being entirely applicable to GMR and other magnetoresistive stacks/structures (e.g., AMR-type devices).

In this disclosure, the term "region" is used generally to refer to one or more layers. That is, a region (as used herein) may include a single layer (deposit, film, coating, etc.) of material or multiple layers of materials stacked on top of one another (i.e., a multi-layer structure). Further, although in the description below, the different regions and/or layers in the disclosed magnetoresistive devices may be referred to by specific names (e.g., first electrode, second electrode, first intermediate layer, second intermediate layer, fixed region, free region, etc.), this is only for ease of description and not intended as a functional description or relative location/orientation of the layer. Moreover, although the description below and the figures appear to depict a certain orientation of the layers relative to each other, those of ordinary skill in the art will understand that such descriptions and depictions are only exemplary. For example, though a certain first region may be depicted as being "below" a certain second region, in some aspects the entire depicted region may be flipped such that the first region is "above" the second region.

For the sake of brevity, conventional techniques related to semiconductor processing may not be described in detail herein. The exemplary embodiments may be fabricated using any suitable now-known or future-developed processes, such as known lithographic processes. The fabrication of integrated circuits, microelectronic devices, micro electro mechanical devices, microfluidic devices, and photonic devices involves the creation of several layers or regions (e.g., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials.

The patterns that define particular regions of devices according to the present disclosure are often created by lithographic processes. For example, a layer of photoresist may be applied onto a layer overlying a wafer substrate. A photo mask (containing clear and opaque areas) may be used to selectively expose the photoresist by a form of radiation, such as ultraviolet light, electrons, or x-rays. Either the photoresist exposed to the radiation, or not exposed to the radiation, may be removed by the application of a developer. An etch may then be employed/applied whereby the layer (or material) not protected by the remaining resist is patterned. Alternatively, an additive process can be used in which a structure is built up using the photoresist as a template.

Magnetoresistive devices of the current disclosure may include magnetic tunnel junction bits (MTJ bits). The MTJ bits may be formed from a magnetoresistive stack/structure that may include, or may be operably coupled to, one or more electrically conductive electrodes, vias, or conductors on either side of the magnetoresistive stack/structure. The magnetoresistive stack/structure that forms the MTJ bits may include many different regions and/or layers of material, where some of the regions and/or layers include magnetic materials, and whereas other regions and/or layers do not. In at least one embodiment, the methods of manufacturing the disclosed devices may include sequentially depositing, growing, sputtering, evaporating, and/or providing (collectively referred herein as "depositing" or other verb tense (e.g., "deposit" or "deposited")) layers and regions which, after further processing (for example, etching), form an MTJ bit (or a plurality of MTJ bits stacked one on top of another or arranged in an array).

As is known in the art, an electrical resistance of the described MTJ bits may change based on whether the magnetization direction (e.g., the direction of the magnetic moment) of a free region adjacent to a non-magnetic layer (e.g., a dielectric layer serving as a tunnel barrier) is in a parallel alignment or in an antiparallel alignment with the magnetization direction (e.g., the direction of the magnetic moment) of a fixed region adjacent to the non-magnetic layer. Typically, if the two regions have the same magnetization alignment, the resulting relatively low resistance is considered as a digital "0," while, if the alignment is antiparallel, the resulting relatively higher resistance is considered to be a digital "1." A memory device (such as an MRAM) may include multiple such MTJ bits, which may be referred to as memory cells or elements, arranged in an array of columns and rows. By measuring the current through each cell, the resistance of each cell, and thus the data stored in the memory array, can be read.

A magnetoresistive stack may have a critical signal strength or value that may be applied in order to change the magnetic state of the stack (e.g., to change the magnetic state of the stack from a parallel, low-resistance orientation, where the magnetization vectors of a free region and a fixed region are in the same direction, to an antiparallel, high-resistance orientation, where the magnetization vectors of the free region and the fixed region are in opposing directions). The resistances of both orientations, as well as the current and pulse duration required to switch between orientations, are affected by the material composition of the magnetoresistive stack, and in particular, the composition of the free region of the magnetoresistive stack.

For some fast-paced write operations (e.g., operations that use a short pulse switching current), a magnetoresistive stack may include a free region designed for reliable short-pulse switching. As will be described in greater detail below, embodiments of the present disclosure relate to the formation of a magnetoresistive stack including a free region designed to exhibit improved magnetic properties. The free region may include one or more insertion layers, interfacial perpendicular magnetic anisotropy inducing layers (iPMA layers), and/or low saturation magnetization layers.

Write operations using a write current pulse with a short duration (e.g., short pulse operations) require either a free region that can be reliably and quickly changed between magnetic states, or a high amplitude write current. Magnetoresistive devices using high amplitude write current have poor endurance, and can quickly lose effectiveness, compared to devices using write currents with a lower amplitude. Therefore, to be used in short pulse operations, a free region should be able to be accurately changed between magnetic states with a short pulse and low amplitude write current.

The inherent variation of switching time within a magnetoresistive device has a greater impact on the required write current in short pulse operations, compared to switching systems using a longer duration switching pulse. Therefore, in designing a free region for use in short pulse operations, the anisotropy field strength ($H_k$) should be maximized, to ease the steep rise and fluctuations in critical current caused by decreasing switching pulse width.

To achieve reliable data retention, the energy barrier ($E_b$) of the free region needs to be maintained at sufficient and constant level. The energy barrier of a free region is proportional to the square root of the product of the anisotropy field strength ($H_k$) and saturation magnetization ($M_S$), as shown by Equation 1:

$$E_b \propto \sqrt[2]{H_k M_S} \qquad \text{Eq. (1)}$$

Therefore, to maintain reliable data retention performance, any material changes to a free region should conserve the product of anisotropy field strength and saturation magnetization. Additionally, increasing the energy barrier generally results in an increased write current. Therefore, composition changes that result in an increased anisotropy field strength should be accompanied by a material change that lowers the saturation magnetization of the free region, to maintain the reliability of data retention performance and while facilitating low amplitude write current operations.

The magnetoresistive structures described in the present disclosure include compositions and structures that induce interfacial perpendicular magnetic anisotropy in the free region, to result in a free region with decreased saturation magnetization and increased anisotropy field strength. These free regions can be incorporated into magnetoresistive stacks to form MTJ bits of a magnetoresistive device with improved reliability with low amplitude and short pulse switching currents. Because the magnetoresistive devices described herein can utilize a low amplitude switching current, they exhibit improved endurance compared to other short pulse switching systems.

For example, magnetoresistive structures described herein may include a free region comprising one or more low saturation magnetization layers and/or one or more iPMA layers. The resulting structures have improved reliability with low amplitude and short pulse switching currents. FIG. 1 shows a graph illustrating the relationship between write current and write error rate for three different single bit MTJ, using a short write pulse width of 3 nanoseconds. FIG. 1 includes curves for magnetoresistive stacks including (i) a conventional free region; (ii) a free region including a low saturation magnetization layer and an iPMA layer; and (iii) a free region including an iPMA layer, with no low saturation magnetization layer. The curves were plotted using the write error rate solution for the Fokker-Plank equation, as described in W. H. Butler, et al., “Switching Distributions for Perpendicular Spin-Torque Devices Within the Macrospin Approximation,” IEEE Transactions on Magnetics, Vol. 48, no. 12 (December 2012), which is incorporated by reference in its entirety.

Referring still to FIG. 1, to illustrate the differences in magnetic properties that result from the inclusion of a low saturation magnetization layer, curve (ii) was plotted as having a decreased product of saturation magnetization and thickness compared to curves (i) and (iii). To illustrate the differences in magnetic properties resulting from the inclusion of an iPMA layer, curves (ii) and (iii) were plotted with an increased $H_k$, compared to curve (i). As described by Equation 1, because curve (iii) has a greater $H_k$ than curve (i), and curve (iii) has a greater saturation magnetization than curve (ii), curve (iii) has a higher energy barrier than curves (i) and (ii). The higher energy barrier of curve (iii) is shown in FIG. 1, where curve (iii) requires more current to have a less than 100% error rate, compared to curves (i) and (ii). The required write current to deviate from the 100% error rate in (ii) is lower than (i), while the energy barrier in (ii) is maintained the same as that in (i), illustrating that the magnetoresistive stack represented by curve (ii) has the reduced write current than the magnetoresistive stack represented by curve (i) while keeping the same data retention performance.

In addition to the differences in energy barriers among the curves (i), (ii), and (iii), shown in FIG. 1, the slope of the curves also illustrates differences in switching fluctuations between the stacks represented by the curves. For example, the slope of curve (ii) is steeper than the slope of curve (i), illustrating that magnetoresistive stack represented by curve (ii) has less switching fluctuation than the magnetoresistive stack represented by curve (i). Stated differently, increasing the write current applied to a stack including a low saturation magnetization layer and an iPMA layer (represented by curve (ii)), results in a greater reduction of write error rate, compared to the same increase in write current applied to the stack without a low saturation magnetization layer and an iPMA layer (represented by curve (i)).

Referring now to FIG. 2, an exemplary magnetoresistive stack 100 is shown, including a fixed region 140, a free region 160, a cap layer 170, and spacer region 180 disposed between a first electrically conductive material 110 (e.g., an electrode, a via, or other conductor) and a second electrically conductive material 120 (e.g., an electrode, a via or other conductor). A seed region 130 may be disposed between the first electrically conductive material 110 and the fixed region 140. Magnetoresistive stack 100 may include a first intermediate layer 150 disposed between the fixed region 140 and the free region 160. The intermediate layer 150 may include a dielectric material, and may function as a tunnel barrier between fixed region 140 and free region 160.

In some embodiments, fixed region 140 is a first fixed region 140 and spacer region 180 may include a second fixed region. The intermediate layer 150 between the first fixed region 140 and free region 160 may be a first intermediate layer 150, and cap layer 170 may include a second intermediate layer (e.g., a dielectric layer functioning as a tunnel barrier).

The first electrically conductive material 110 and/or second electrically conductive material 120 may provide electrical connections between magnetoresistive stack 100 and other components, vias, and/or magnetoresistive stacks 100 of a magnetoresistive device. The first electrically conductive material 110 and second electrically conductive material 120 may have the same composition, or may include different materials. For example, first electrically conductive material 110 and/or second electrically conductive material may comprise copper (Cu), tantalum (Ta), one or more metals, or another electrically conductive material.

In some embodiments, a seed region 130 may be formed directly on or above first electrically conductive material 110. The seed region 130 may act as a surface on which one or more layers of a fixed region 140 may be formed (e.g., directly or indirectly) and allows current to pass bi-directionally from the first electrically conductive material 110 to the fixed region 140. The seed region 130 may include one or more of nickel (Ni), chromium (Cr), cobalt (Co), iron (Fe), or alloys thereof. In some embodiments, the seed region 130 may include an alloy including nickel (Ni) and chromium (Cr), such as, e.g., a NiCr alloy. The seed region 130 may further include one or more other metals or metal alloys, such as, by way of non-limiting example, palladium (Pd), platinum (Pt), nickel (Ni), tantalum (Ta), ruthenium (Ru), tungsten (W), molybdenum (Mo), iron-boron (FeB), cobalt-iron-boron (CoFeB), tantalum-nitride (TaN), or combinations thereof.

In one or more embodiments, a fixed region (e.g., first fixed region 140 or second fixed region) may include a fixed, unpinned synthetic antiferromagnet (SAF) multilayer structure. The fixed, unpinned SAF multilayer structure may include at least two magnetic regions (e.g., made of one or more layers) separated by a coupling region. For example, referring to FIG. 3, a fixed region 140 may include a first magnetic region 142, a coupling region 145, a second magnetic region 146, a transition layer 147, and a reference layer 149. First magnetic region 142 and second magnetic region 146 may include nickel (Ni), iron (Fe), and cobalt (Co), palladium (Pd), platinum (Pt), chromium (Cr), manganese (Mn), magnesium (Mg), and alloys or combinations thereof. First magnetic region 142 may have the same composition as second magnetic region 146, or first magnetic region 142 may have a different composition than second magnetic region 146. In some embodiments, first magnetic region 142 and/or second magnetic region 146 may comprise a magnetic multilayer structure that includes a plurality of layers of a first ferromagnetic material (e.g., cobalt (Co)), a second ferromagnetic material (e.g., nickel (Ni)), and/or a paramagnetic material (e.g., platinum (Pt)). The coupling region 145 may include an antiferromagnetic coupling layer that includes non-ferromagnetic materials such as, for example, iridium (Ir), ruthenium (Ru), rhenium (Re), or rhodium (Rh).

Figure 3:
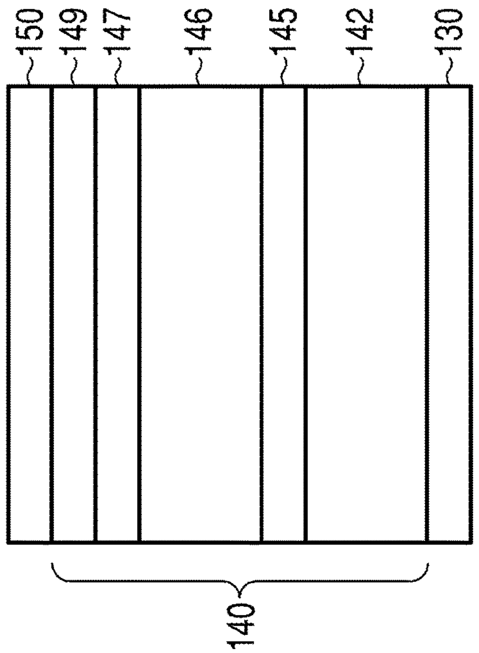

Still referring to FIG. 3, fixed region 140 may include a transition layer 147 between the second magnetic region 146 and the intermediate layer 150 of magnetoresistive stack 100. In embodiments where fixed region 140 includes a reference layer 149, transition layer 147 may be in contact with both the second magnetic region 146 and reference layer 149. Transition layer may include one or metals, such as, for example, tantalum (Ta), tungsten (W), and/or molybdenum (Mo). Transition layer 147 may have a thickness greater than or equal to approximately 2 Å, less than or equal to approximately 5 Å, or approximately 2 Å to approximately 5 Å.

Fixed region 140 may include a reference layer 149 between the second magnetic region 146 and the intermediate layer 150 of magnetoresistive stack 100. In embodiments where fixed region 140 includes a transition layer 147, reference layer 149 may be in contact with both transition layer 147 and intermediate layer 150. Reference layer 149 may comprise a magnetic material. For example, reference layer 149 may comprise, cobalt, iron, or an alloy including cobalt and iron (e.g., CoFeB). Reference layer 149 may have a thickness greater than or equal approximately 6 Å, less than or equal to approximately 11 Å, or approximately 6 Å to approximately 11 Å.

Additionally, or in the alternative, in some embodiments, fixed region 140 may include one or more synthetic ferromagnetic structures (SyF). Since SyFs are known to those skilled in the art, they are not described in greater detail herein. In some embodiments, the fixed region 140 may have a thickness of approximately 8 Å to approximately 300 Å, approximately 15 Å to approximately 110 Å, greater than or equal to 8 Å, greater than or equal to 15 Å, less than or equal to 300 Å, or less than or equal to 110 Å.

Intermediate layer 150 may include a metal oxide or other material capable of forming a tunnel barrier of a magnetic tunnel junction including free region 160. For example, intermediate layer 150 may comprise magnesium oxide (MgO), aluminum oxide (AlOx), one or more other metal oxides, or a combination thereof. Intermediate layer 150 may have a thickness of approximately 6 Å to approximately 20 Å, such as, for example, approximately 8 Å to approximately 16 Å. Intermediate layer 150 (e.g., an intermediate layer 150 comprising metal oxide) may induce interfacial perpendicular magnetic anisotropy in the fixed region 140 and the free region 160.

Cap layer 170 may comprise magnesium oxide (MgO), aluminum oxide (AlOx), one or more other metal oxides, metals, or a combination thereof. Cap layer 170 (e.g., a cap layer 170 including metal oxide) may induce interfacial perpendicular magnetic anisotropy in the free region 160. In some embodiments, cap layer 170 includes a second intermediate layer capable of forming a tunnel barrier of a magnetic tunnel junction including free region 160. Cap layer 170 may have a thickness of approximately 5 Å to approximately 18 Å, such as, for example, approximately 7 Å to approximately 15 Å.

Spacer region 180 may comprise iron (Fe), cobalt (Co), ruthenium (Ru), tungsten (W), an alloy including iron and/or cobalt (e.g., CoFeB), or a combination thereof. In some embodiments, spacer region 180 includes a second fixed region that may have a thickness of approximately 8 Å to approximately 300 Å, approximately 15 Å to approximately 110 Å, greater than or equal to 8 Å, greater than or equal to 15 Å, less than or equal to 300 Å, or less than or equal to 110 Å.

Referring again to FIG. 2, free region 160 may include one or more layers of ferromagnetic material (e.g., first ferromagnetic layer 162 and/or second ferromagnetic layer 164). First ferromagnetic layer 162 may include cobalt, iron, boron, alloys comprising cobalt, iron, and/or boron (e.g., CoFe, CoFeB, etc.), or a combination thereof. Second ferromagnetic layer 164 may include cobalt, iron, boron, alloys comprising cobalt, iron, and/or boron (e.g., CoFe, CoFeB, etc.), or a combination thereof. In some embodiments, first ferromagnetic layer 162 has the same composition as second ferromagnetic layer 164. In other embodiments, first ferromagnetic layer 162 has a different composition than second ferromagnetic layer 164. For example, first ferromagnetic layer 162 may include an alloy comprising cobalt and iron, and second ferromagnetic layer 164 may include an alloy comprising cobalt, iron, and boron.

First ferromagnetic layer 162 may have a thickness of approximately 2 Å to approximately 12 Å, such as, for example, approximately 3 Å to approximately 11 Å, or approximately 4 Å to approximately 10 Å. Second ferromagnetic layer 164 may have a thickness of approximately 1 Å to approximately 9 Å, such as, for example, approximately 2 Å to approximately 8 Å, or approximately 3 Å to approximately 7 Å.

Notwithstanding the specific construction of free region 160, free region 160 may include a magnetic vector (or moment) that can be moved or switched by applied magnetic fields or spin transfer torque. Free region 160 also may include one or more synthetic antiferromagnetic (SAF) or synthetic ferromagnetic (SyF) structures.

Free region 160 may include one or more insertion layers, low saturation magnetization layers, and/or iPMA layers to improve reliability with low amplitude and short pulse switching currents.

Free region 160 may include one or more insertion layers. Insertion layer may comprise molybdenum (Mo), tungsten (W), tantalum (Ta), ruthenium (Ru), rhodium (Rh), rhenium (Re), iridium (Ir), chromium (Cr), osmium (Os), or a combination thereof. Insertion layer may have a thickness of approximately 1 Å to approximately 6 Å, such as, for example, approximately 1 Å to approximately 5 Å. In some embodiments, such as those shown in FIG. 2, insertion layer 165 may be disposed between first ferromagnetic layer 162 and second ferromagnetic layer 164. Inclusion of one or more insertion layers 165 may change crystal growth and magnetic properties of the free region 160, resulting in a free region 160 that requires less switching current, a shorter switching pulse width, or both.

Free region 160 may include one or more iPMA layers. iPMA layer may comprise magnesium oxide (MgO), aluminum oxide (AlOx), other metal oxides, platinum (Pt), nickel (Ni), or a combination thereof iPMA layer may have a thickness greater than or equal to approximately 2 Å, less than or equal to approximately 12 Å, or approximately 2 Å to approximately 12 Å. Inclusion of one or more iPMA layers may increase the anisotropy field of the free region 160, which allows for the inclusion of one or more other structures that decrease the magnetization of the free region 160 while retaining the data retention performance. As a result, free region 160 including one or more iPMA layers may requires less switching current, a shorter switching pulse width, or both, compared to free region 160 without an iPMA layer.

Free region 160 may include one or more low saturation magnetization layers. Low saturation magnetization layers may have a lower saturation magnetization than the one or more layers of ferromagnetic material (e.g., first ferromagnetic layer 162). Low saturation magnetization layer may comprise an alloy including nickel (Ni), iron (Fe), and boron (B), and/or having the formula $(Ni_{100-x}Fe_x)_{100-y}B_y$, where x is greater than or equal to approximately 50 and less than or equal to approximately 95, and y is greater than or equal to approximately 5 and less than or equal to approximately 30. In addition, or alternatively, low saturation magnetization layer may comprise an alloy including cobalt (Co), iron (Fe), and boron (B), and/or having the formula $(CoFe)_{100-x-y}M_xB_y$, where x is greater than or equal to approximately 10 and less than or equal to approximately 25, y is greater than or equal to approximately 15 and less than or equal to approximately 25, and M is tantalum (Ta), zirconium (Zr), chromium (Cr), or vanadium (V). In addition, or alternatively, low saturation magnetization layer may comprise an alloy comprising iron (Fe) and vanadium (V), and/or having the formula $Fe_{100-x}V_x$, where x is greater than or equal to approximately 10 and less than or equal to approximately 30, such as, for example, approximately 15. In addition, or alternatively, low saturation magnetization layer may comprise an alloy comprising gadolinium (Gd), iron (Fe), and cobalt (Co).

Low saturation magnetization layer may have a thickness of greater than approximately 1 Å, less than approximately 9 Å, or approximately 1 Å to approximately 9 Å.

As previously described, increasing the anisotropy field strength of free region 160 (e.g., by including one or more iPMA layers and/or insertion layers 165), can deleteriously affect the critical switching current of the magnetoresistive stack. This can result in increased write current, which reduces the endurance and lifetime of the magnetoresistive stack. In some embodiments, inclusion of a low saturation magnetization layer can mitigate or eliminate the negative effects of increased anisotropy field strength.

In conventional magnetoresistive stacks, include of a low saturation magnetization layer within free region 160 may decrease the spin polarization of the free region 160, resulting in an increased sensing error rate due to decreased magnetoresistance. However, in the embodiments described herein, low saturation magnetization layers may be located in a portion of free region 160 that has sufficient distance from intermediate layer 150 to avoid adverse effects on spin polarization from the inclusion of the low saturation magnetization layers. In conventional magnetoresistive stacks, inclusion of a low saturation magnetization layer may also lower the exchange stiffness constant, $A_{ex}$, of the free region 160, which can result in poor data retention performance due to a lower energy barrier. However, embodiments of the present disclosure may include one or more iPMA layers that may induce interfacial perpendicular magnetic anisotropy and increase the total thickness of the free region 160. The increased thickness of free region 160 may mitigate the adverse effect of a low saturation magnetization layer on the exchange stiffness constant. Similarly, in conventional magnetoresistive stacks, inclusion of a low saturation magnetization layer can lead to a higher damping constant. Free regions 160 described herein may include one or more iPMA layers, which can induce interfacial perpendicular magnetic anisotropy and increase the total thickness of the free region 160. The increased thickness of free region 160 may mitigate the adverse effect of a low saturation magnetization layer on the damping constant of free region 160. Some low saturation magnetization layer compositions may be configured to have a relatively low damping constant. compared to other low saturation magnetization layer compositions. For example, a low saturation magnetization layer comprising an alloy comprising iron (Fe) and vanadium (V), and/or having the formula $Fe_{100-x}V_x$, where x is greater than or equal to approximately 10 and less than or equal to approximately 30, may have a relatively low damping constant compared to other low saturation magnetization layer compositions described herein.

One or more insertion layers 165, iPMA layers 265, and/or low saturation magnetization layers 260 may be arranged with the one or more ferromagnetic layers (e.g., first ferromagnetic layer 162, second ferromagnetic layer 164, third ferromagnetic layer 166, and/or fourth ferromagnetic layer 168) to provide a free region 160 that results in improved reliability and date retention when using low amplitude and short pulse switching currents. Exemplary free regions 160 including insertion layers 165, iPMA layers 265, and/or low saturation magnetization layers 260 are shown in FIGS. 4-9.

Figure 4:
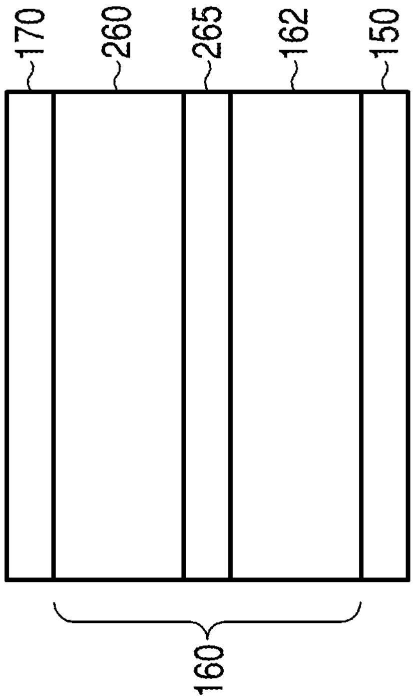

Referring to FIG. 4, free region 160 may include a first ferromagnetic layer 162 in contact with intermediate layer 150, and a low saturation magnetization layer 260 in contact with cap layer 170. Free region 160 may further include an iPMA layer 265 disposed between first ferromagnetic layer 162 and low saturation magnetization layer 260.

Figure 5:
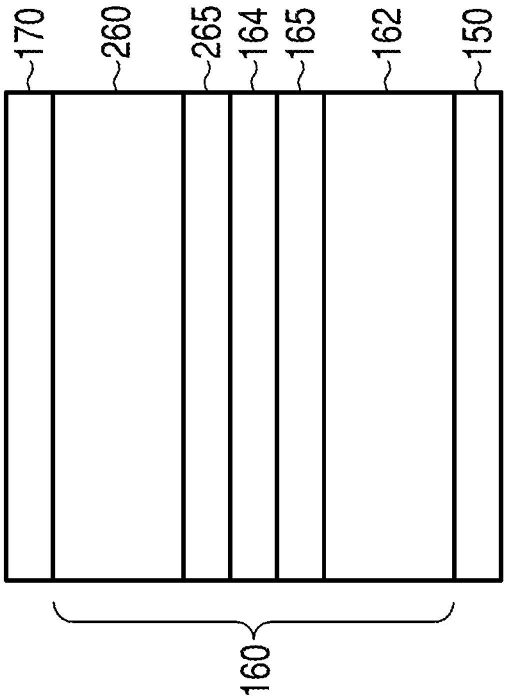

Referring to FIG. 5, free region 160 may include a first ferromagnetic layer 162 in contact with intermediate layer 150, and a low saturation magnetization layer 260 in contact with cap layer 170. Free region 160 may further include an insertion layer 165 disposed above and/or in contact with first ferromagnetic layer 162. Free region 160 may further include an iPMA layer 265 disposed below and/or in contact with low saturation magnetization layer 260. Free region 160 may also include a second ferromagnetic layer 164 disposed between insertion layer 165 and iPMA layer 265. In some embodiments, second ferromagnetic layer 164 is in contact with both insertion layer 165 and iPMA layer 265.

Figure 6:
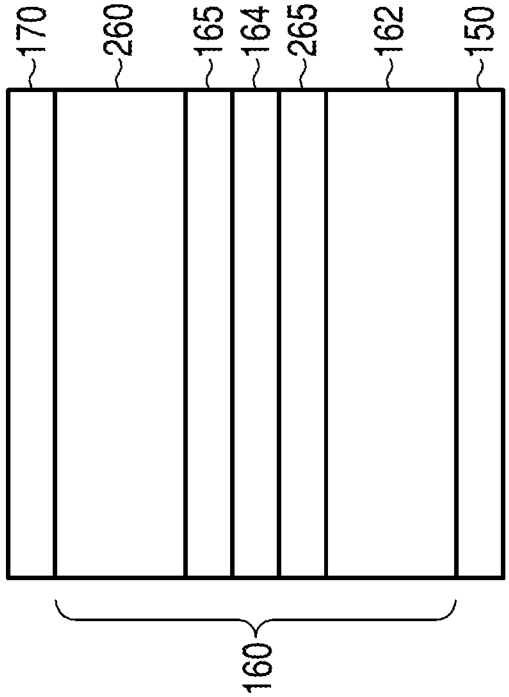

Referring to FIG. 6, free region 160 may include a first ferromagnetic layer 162 in contact with intermediate layer 150, and a low saturation magnetization layer 260 in contact with cap layer 170. Free region 160 may further include an iPMA layer 265 disposed above and/or in contact with first ferromagnetic layer 162. Free region 160 may further include an insertion layer 165 disposed below and/or in contact with low saturation magnetization layer 260. Free region 160 may also include a second ferromagnetic layer 164 disposed between insertion layer 165 and iPMA layer 265. In some embodiments, second ferromagnetic layer 164 is in contact with both insertion layer 165 and iPMA layer 265.

Figure 7:
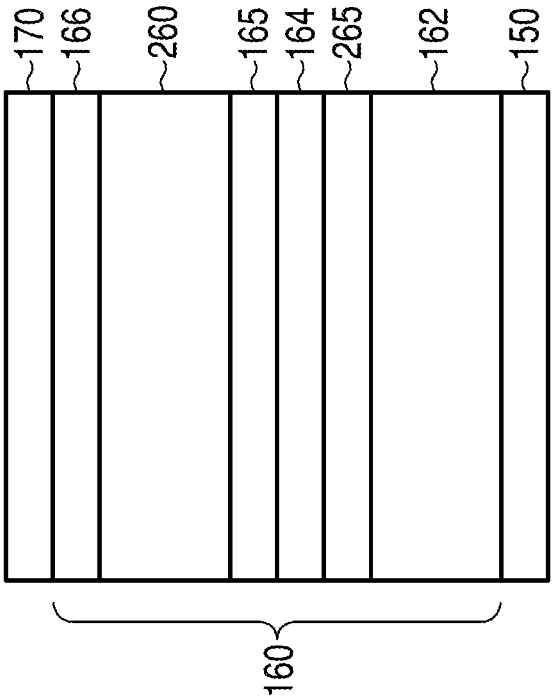

Referring to FIG. 7, free region 160 may include a first ferromagnetic layer 162 in contact with intermediate layer 150, and a third ferromagnetic layer 166 in contact with cap layer 170. Third ferromagnetic layer 166 may include cobalt, iron, boron, alloys comprising cobalt, iron, and/or boron (e.g., CoFe, CoFeB, etc.), or a combination thereof. In some embodiments, third ferromagnetic layer 166 has the same composition as first ferromagnetic layer 162 and/or second ferromagnetic layer 164. In other embodiments, third ferromagnetic layer 166 has a different composition than first ferromagnetic layer 162 and/or second ferromagnetic layer 164. Third ferromagnetic layer 166 may have a thickness of approximately 1 Å to approximately 6 Å, such as, for example, approximately 1.5 Å to approximately 4 Å or approximately 2 Å to approximately 3.5 Å.

Still referring to FIG. 7, free region 160 may include an iPMA layer 265 above and/or in contact with first ferromagnetic layer 162. Free region 160 may include a low saturation magnetization layer 260 below and/or in contact with third ferromagnetic layer 166. Free region 160 may further include an insertion layer 165 below and/or in contact with low saturation magnetization layer 260. Free region may include a second ferromagnetic layer 164 disposed between insertion layer 165 and iPMA layer 265. In some embodiments, second ferromagnetic layer 164 is in contact with both insertion layer 165 and iPMA layer 265.

Figure 8:
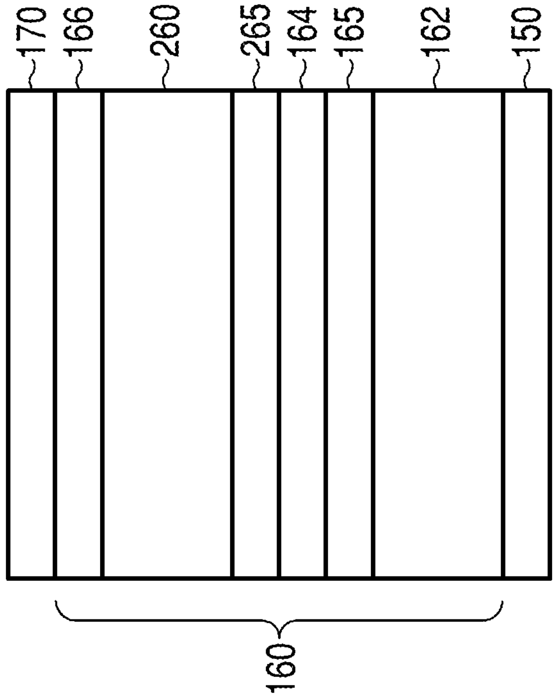

Referring to FIG. 8, free region 160 may include a first ferromagnetic layer 162 in contact with intermediate layer 150, and a third ferromagnetic layer 166 in contact with cap layer 170. Free region 160 may further include an insertion layer 165 disposed above and/or in contact with first ferromagnetic layer 162. Free region 160 may include a low saturation magnetization layer 260 below and/or in contact with third ferromagnetic layer 166. Free region may also include an iPMA layer 265 below and/or in contact with low saturation magnetization layer 260. Free region may include a second ferromagnetic layer 164 disposed between insertion layer 165 and iPMA layer 265. In some embodiments, second ferromagnetic layer 164 is in contact with both insertion layer 165 and iPMA layer 265.

Figure 9:
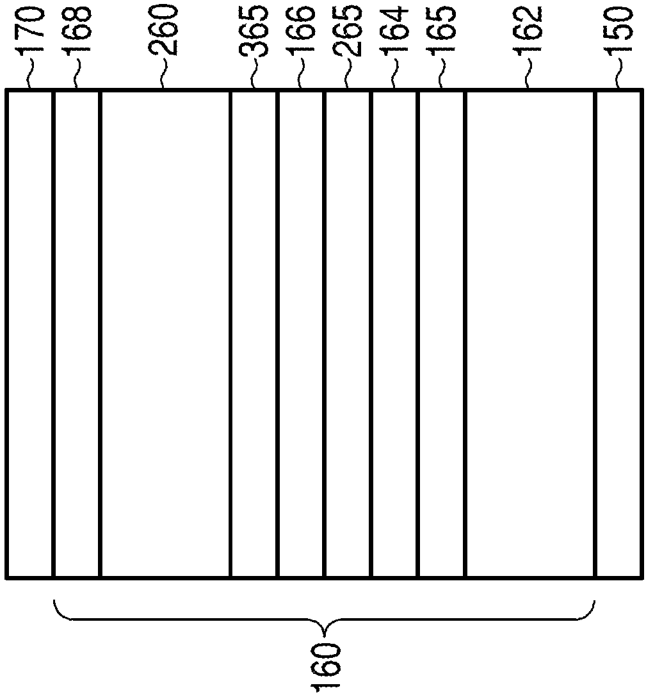

Referring to FIG. 9, free region 160 may include a first ferromagnetic layer 162 in contact with intermediate layer 150, and a fourth ferromagnetic layer 168 in contact with cap layer 170. Fourth ferromagnetic layer 168 may include cobalt, iron, boron, alloys comprising cobalt, iron, and/or boron (e.g., CoFe, CoFeB, etc.), or a combination thereof. In some embodiments, fourth ferromagnetic layer 168 has the same composition as first ferromagnetic layer 162, second ferromagnetic layer 164, and/or third ferromagnetic layer 166. In other embodiments, fourth ferromagnetic layer 168 has a different composition than first ferromagnetic layer 162, second ferromagnetic layer 164, and/or third ferromagnetic layer 166. Fourth ferromagnetic layer 168 may have a thickness of approximately 1 Å to approximately 6 Å, such as, for example, approximately 1.5 Å to approximately 4 Å or approximately 2 Å to approximately 3.5 Å.

Still referring to FIG. 9, free region 160 may include a first insertion layer above and/or in contact with first ferromagnetic layer 162. Free region 160 may include a low saturation magnetization layer 260 below and/or in contact with fourth ferromagnetic layer 168. Free region 160 may also include a second ferromagnetic layer 164 above and/or in contact with first insertion layer 165. In some embodiments, free region 160 may include a second insertion layer 365, for example, a second insertion layer 365 disposed below and in contact with low saturation magnetization layer 260. Second insertion layer 365 may comprise molybdenum (Mo), tungsten (W), tantalum (Ta), ruthenium (Ru), rhodium (Ro), rhenium (Re), iridium (Ir), chromium (Cr), osmium (Os), or a combination thereof. Second insertion layer 365 may have a thickness of approximately 1 Å to approximately 6 Å, such as, for example, approximately 1.5 Å to approximately 5 Å.

Still referring to FIG. 9, free region 160 may include a third ferromagnetic layer 166 below and/or in contact with second insertion layer 365. Free region 160 may include an iPMA layer 265 disposed between the second ferromagnetic layer 164 and the third ferromagnetic layer 166. In some embodiments, iPMA layer 265 is in contact with both second ferromagnetic layer 164 and third ferromagnetic layer 166.

In some embodiments, layers and regions of magnetoresistive stack 100, including layers of free region 160 may be deposited using any technique now known or later developed. In some embodiments, one or more of layers of the free region 160 may be deposited using a "heavy" inert gas (e.g., xenon (Xe), argon (Ar), krypton (Kr)), at room temperature, approximately 25° C., approximately 15° C. to approximately 40° C., approximately 20° C. to approximately 30° C. In some embodiments, one or more of the layers of free region 160 may be deposited using a "heavy" inert gas (e.g., xenon (Xe), argon (Ar), krypton (Kr)), at temperatures greater than approximately 25° C., such as, for example, greater than approximately 150° C.

The various regions or layers of magnetoresistive stack 100 may be deposited individually during manufacture. However, as would be recognized by those of ordinary skill in the art, the materials that make up the various regions may alloy with (intermix with and/or diffuse into) the materials of adjacent regions during subsequent processing (e.g., deposition of overlying layers, high temperature or reactive etching technique, and/or annealing).

Exemplary methods for forming a magnetoresistive stack 100 according to embodiments of the present disclosure will now be discussed, and reference to parts and the numbered labels shown in FIGS. 2-9 may be made.

FIG. 10 is a flow chart of a method 1000 of manufacturing a magnetoresistive stack 100, according to the present disclosure. A first electrically conductive material 110 (e.g., an electrode, via, and/or conductor) may be formed above a substrate, such as, for example, a silicon-based substrate (step 1100). A first fixed region 140 may be formed above the first electrically conductive material 110 (step 1200). Optionally, a seed region 130 may be formed on the first electrically conductive material 110, prior to step 1200. An intermediate layer 150 (e.g., a dielectric layer) may then be formed above the first fixed region 140 (step 1300). A free region 160 may be formed above the first intermediate layer 150 (step 1400). A cap layer 170 (e.g., a dielectric layer) may then be formed above the free region 160 (step 1500). A spacer region 180 (e.g., including a secondary fixed region) may then be formed above cap layer 170 (step 1600). A second electrically conductive material 120 (e.g., an electrode, via, and/or conductor) may also be formed (e.g., above spacer region 180), thereby providing electrical connectivity to magnetoresistive stack 100 (step 1700).

The steps involved in formation of free region 160 may vary, depending on the design of free region 160. FIGS. 11-15 are flow charts of methods of manufacturing free region 160 (i.e., step 1400 of method 1000), according to one or more aspects of the present disclosure.

Figure 11:
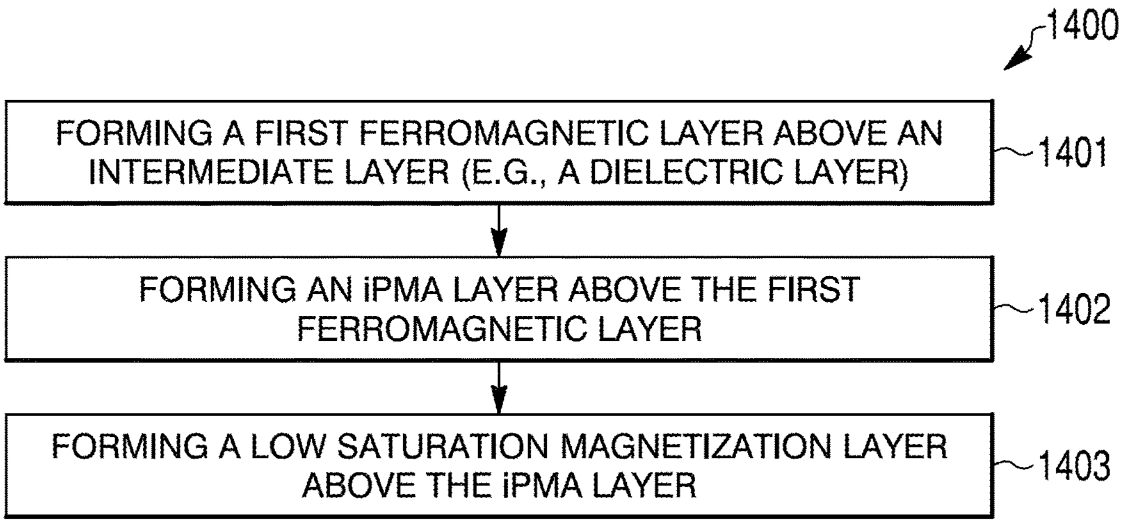

FIG. 11 is a flow chart of a method of step 1400 of forming a free region 160, according to the present disclosure. A first ferromagnetic layer 162 may be formed above an intermediate layer 150 (e.g., a dielectric layer) (step 1401). Method of step 1400 may further include forming an iPMA layer 265 above the first ferromagnetic layer 162 (step 1402). A low saturation magnetization layer 260 may then be formed above the iPMA layer 265 (step 1403).

Figure 12:
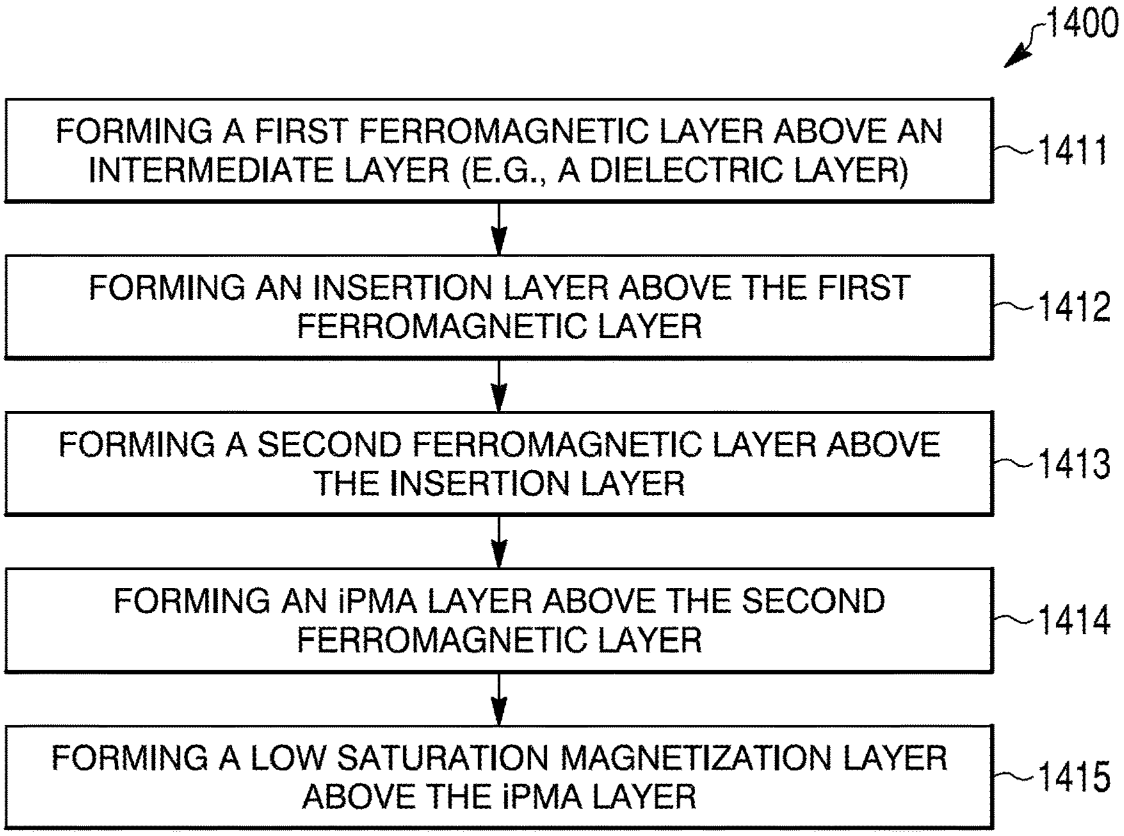

FIG. 12 is a flow chart of a method of step 1400 of forming a free region 160, according to the present disclosure. A first ferromagnetic layer 162 may be formed above an intermediate layer 150 (e.g., a dielectric layer) (step 1411). Method of step 1400 may further include forming an insertion layer 165 above the first ferromagnetic layer 162 (step 1412). A second ferromagnetic layer 164 may then be formed above insertion layer 165 (step 1413). Next, an iPMA layer 265 may be formed above the second ferromagnetic layer 164 (step 1414). Method of step 1400 may also include forming a low saturation magnetization layer 260 above the iPMA layer 265 (step 1415).

Figure 13:
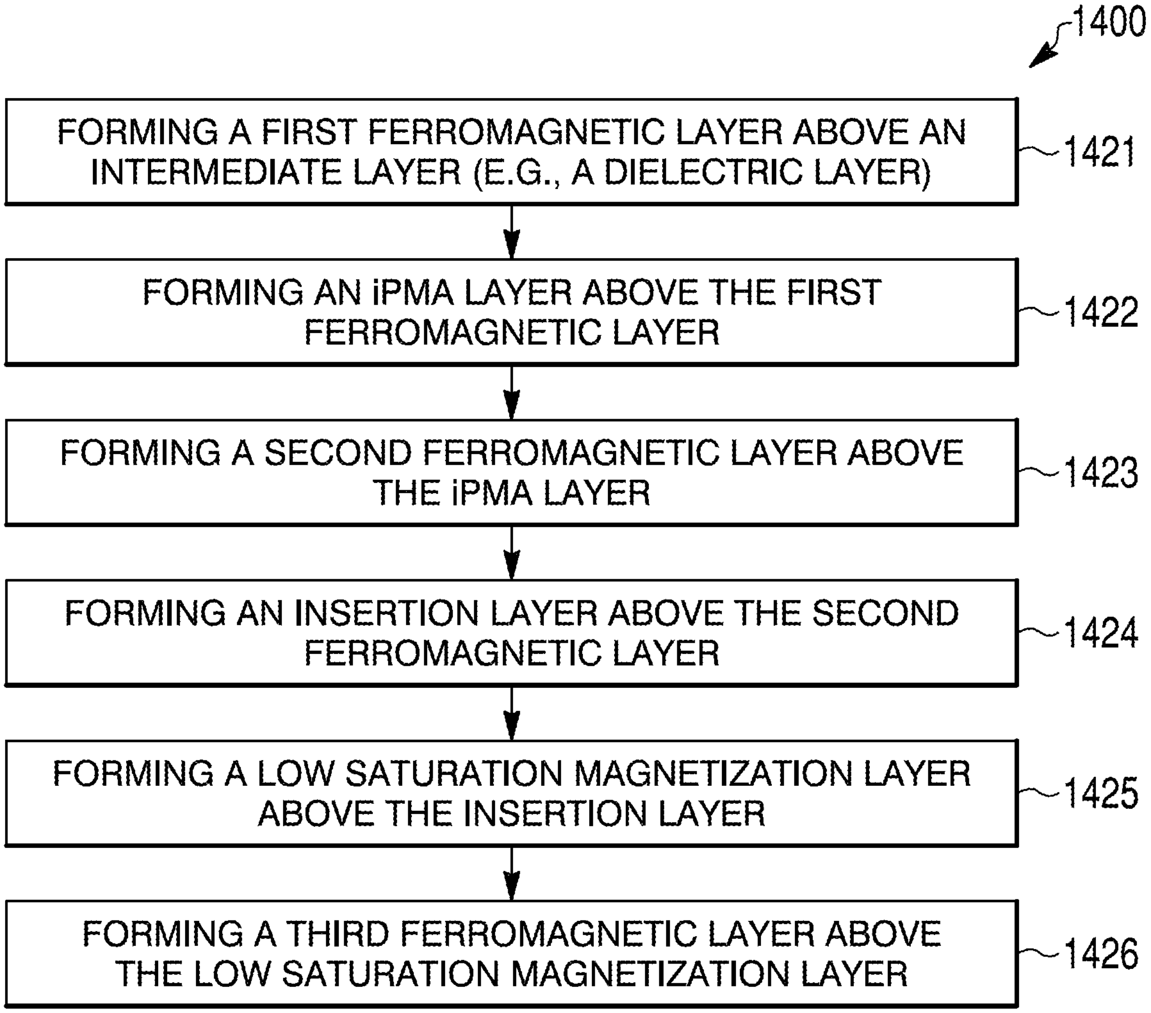

FIG. 13 is a flow chart of a method of step 1400 of forming a free region 160, according to the present disclosure. A first ferromagnetic layer 162 may be formed above an intermediate layer 150 (e.g., a dielectric layer) (step 1421). Method of step 1400 may further include forming an iPMA layer 265 above the first ferromagnetic layer 162 (step 1422). A second ferromagnetic layer 164 may then be formed above iPMA layer 265 (step 1423). Next, an insertion layer 165 may be formed above the second ferromagnetic layer 164 (step 1424). A low saturation magnetization layer 260 may be formed above the insertion layer 165 (step 1425). Optionally, method of step 1400 may also include forming a third ferromagnetic layer 166 above the low saturation magnetization layer 260 (step 1426).

Figure 14:
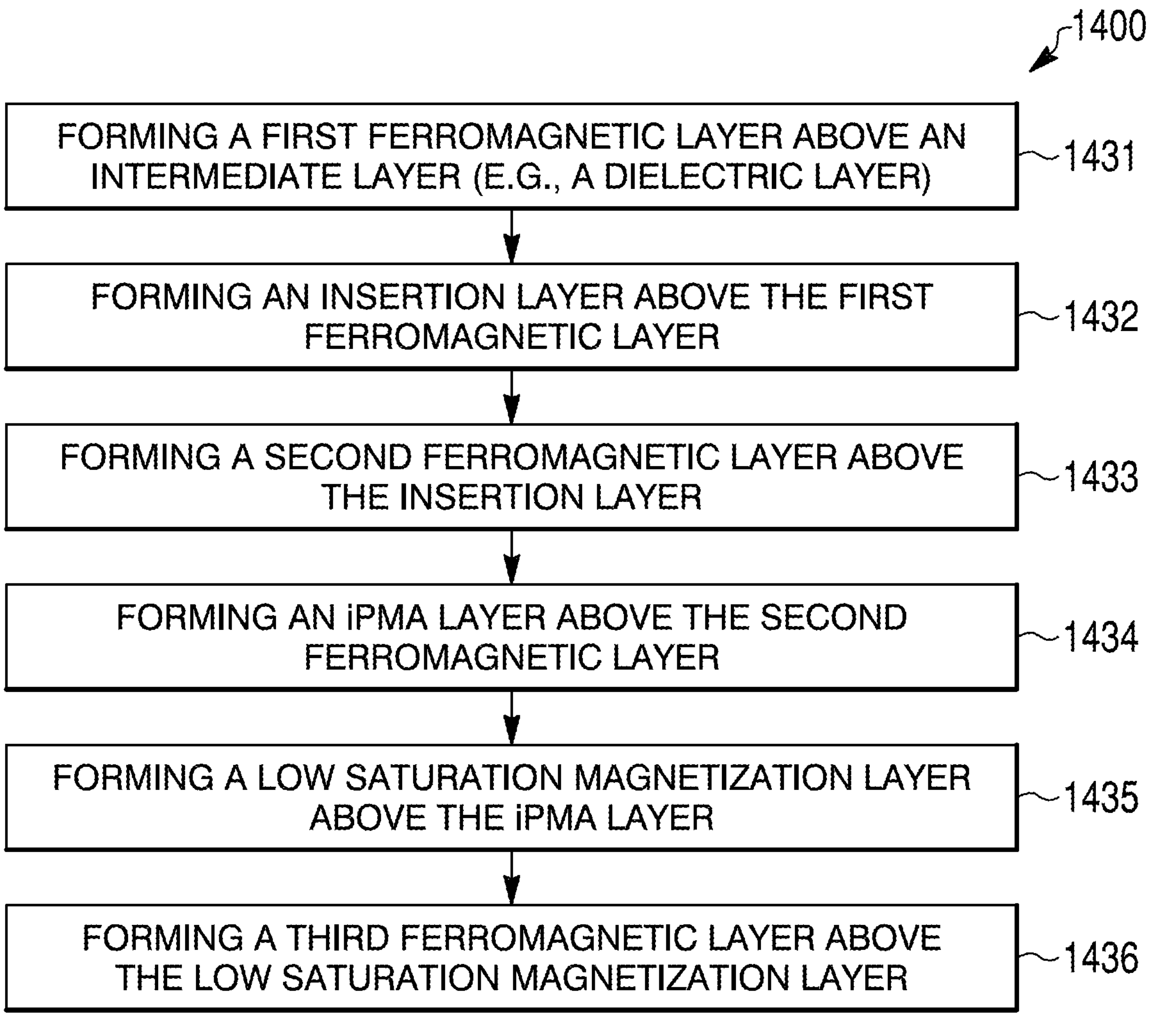

FIG. 14 is a flow chart of a method of step 1400 of forming a free region 160, according to the present disclosure. A first ferromagnetic layer 162 may be formed above an intermediate layer 150 (e.g., a dielectric layer) (step 1431). An insertion layer 165 may then be formed above the first ferromagnetic layer 162 (step 1432). A second ferromagnetic layer 164 may then be formed above insertion layer 165 (step 1433). Next, an iPMA layer 265 may be formed above the second ferromagnetic layer 164 (step 1434). Method of step 1400 may also include forming a low saturation magnetization layer 260 above the iPMA layer 265 (step 1435). A third ferromagnetic layer 166 may then be formed above low saturation magnetization layer 260 (step 1436).

Figure 15:
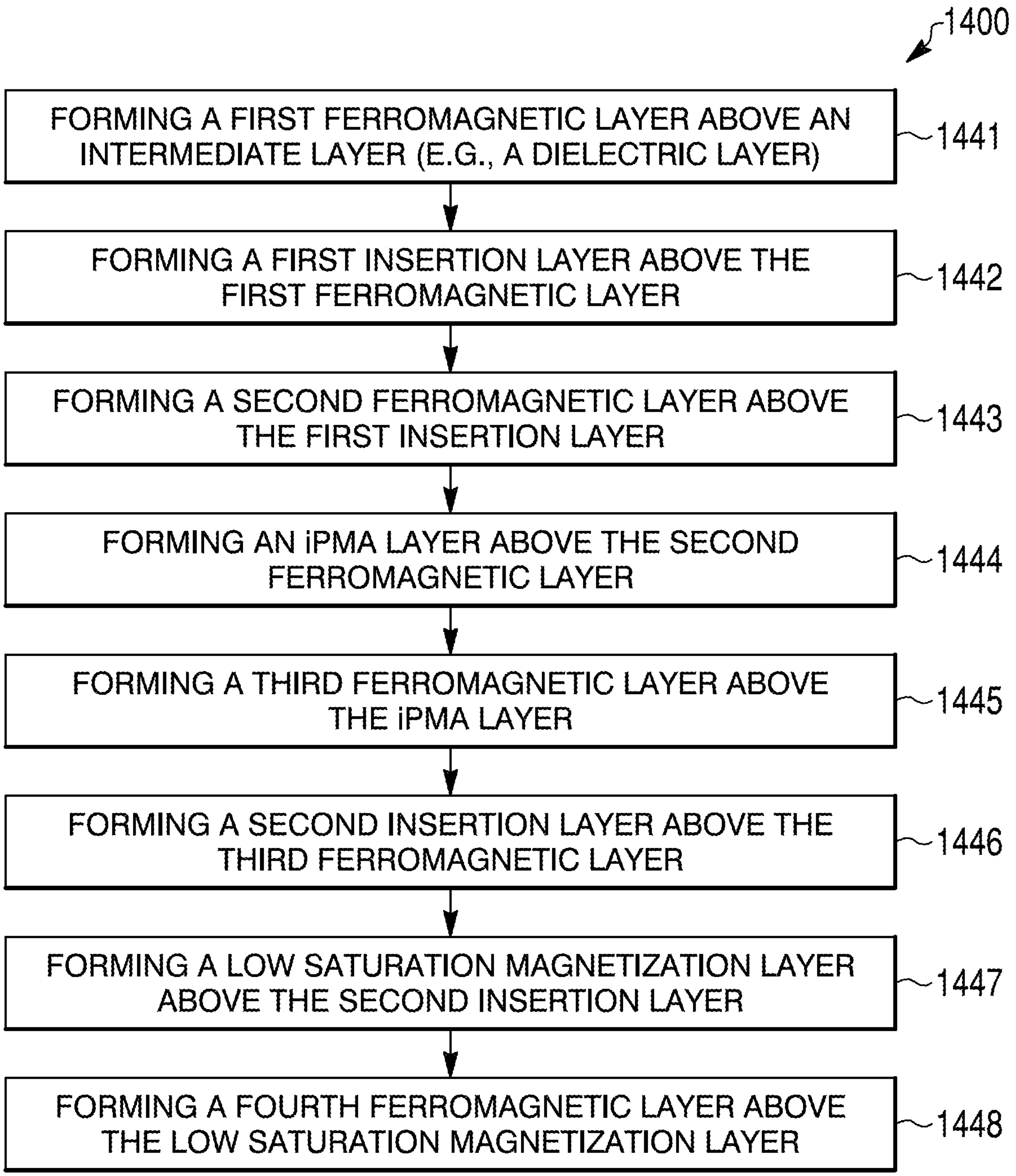

FIG. 15 is a flow chart of a method of step 1400 of forming a free region 160, according to the present disclosure. A first ferromagnetic layer 162 may be formed above an intermediate layer 150 (e.g., a dielectric layer) (step 1441). An insertion layer 165 may then be formed above the first ferromagnetic layer 162 (step 1442). Method of step 1400 may also include forming a second ferromagnetic layer 164 above insertion layer 165 (step 1443). Next, an iPMA layer 265 may be formed above the second ferromagnetic layer 164 (step 1444). A third ferromagnetic layer 166 may then be formed above iPMA layer 265 (step 1445). Method of step 1400 may further include forming a second insertion layer 365 above the third ferromagnetic layer 166 (step 1446). Next, a low saturation magnetization layer 260 may be formed above the second insertion layer 365. A fourth ferromagnetic layer 168 may then be formed above the low saturation magnetization layer 260.

While the steps of methods 1000 and 1400 have been depicted in a particular order, it is to be understood by those of ordinary skill in the art that such steps may be performed in any suitable order (e.g., in reverse order). Additionally, steps may be repeated, added, or omitted according to techniques known in the art.

Since suitable integrated circuit fabrication techniques (e.g., deposition, sputtering, evaporation, plating, etc.) that may be used to form the different regions are known to those of ordinary skill in the art, they are not described here in great detail. It should be noted that while not specifically described, various deposition processes (e.g., any physical vapor deposition (PVD) or chemical vapor deposition (CVD) process known in the art, such as sputtering, magneton sputtering, ion beam deposition, atomic layer deposition, evaporative techniques, etc.) may be used to form the various layers of the exemplary magnetoresistive stacks 100 and free regions 160 thereof. Further, various lithographic processes, etching processes, or finishing steps common in the art (e.g., ion beam etching, chemical etching, chemical-physical planarization) may be performed after the formation of one or more layers of the exemplary magnetoresistive stacks.

In some embodiments, forming some of the regions may involve thin-film deposition processes, including, but not limited to, physical vapor deposition techniques such as ion beam sputtering and magnetron sputtering. Forming thin insulating layers may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to a low-pressure oxygen environment. In some embodiments, formation of some or all of the regions of a magnetoresistive stack may also involve known processing steps such as, for example, selective deposition, photolithography processing, etching, etc., in accordance with any of the various conventional techniques known in the semiconductor industry.

In some embodiments, during deposition of the disclosed fixed and free regions (e.g., fixed region 140, free region 160, spacer region 180), a magnetic field may be provided to set a preferred easy magnetization axis of the region (e.g., via induced anisotropy). Similarly, a strong magnetic field applied during the post-deposition high-temperature anneal step may be used to induce a preferred easy magnetization axis and a preferred pinning direction for any antiferromagnetically pinned materials.

As alluded to above, the magnetoresistive devices of the present disclosure, including one or more exemplary free regions 160 described herein, may be implemented in a sensor architecture or a memory architecture (among other architectures). For example, in a memory configuration, the magnetoresistive devices, including an example magnetoresistive stack 100 described herein, may be electrically connected to one or more access transistors and configured to couple or connect to various conductors, which may carry one or more control signals, as shown in FIG. 16. The magnetoresistive devices of the current disclosure may be used in any suitable application, including, e.g., in a memory configuration. In such instances, the magnetoresistive devices may be formed as an integrated circuit comprising a discrete memory device (e.g., as shown in FIG. 17A) or an embedded memory device having a logic therein (e.g., as shown in FIG. 17B), each including MRAM, which, in one embodiment is representative of one or more arrays of MRAM having a plurality of magnetoresistive stacks, according to certain aspects of certain embodiments disclosed herein.

In one embodiment, a magnetoresistive stack is disclosed. The magnetoresistive stack includes a fixed region having a fixed magnetic state, a free region configured to have a first magnetic state and a second magnetic state, and a dielectric layer disposed between the fixed region and the free region. The free region comprises a layer of ferromagnetic material, a low saturation magnetization layer, and an iPMA layer comprising a metal, a metal oxide, or both. Various embodiments of the disclosed magnetoresistive stack may additionally or alternatively include one or more of the following features: the low saturation magnetization layer comprises an alloy including nickel, iron, and boron, an alloy including cobalt, iron, boron, and tantalum, an alloy including cobalt, iron, boron, and zirconium, an alloy including cobalt, iron, boron, and chromium, an alloy including iron and vanadium, and/or an alloy including gadolinium, iron, and cobalt; the low saturation magnetization layer comprises an alloy having the formula $(Ni_{100-x}Fe_x)_{100-y}B_y$, where x is greater than or equal to approximately 50 and less than or equal to approximately 95, and y is greater than or equal to approximately 5 and less than or equal to approximately 30, an alloy having the formula $(CoFe)_{100-x-y}M_xB_y$, where x is greater than or equal to approximately 10 and less than or equal to approximately 25, y is greater than or equal to approximately 15 and less than or equal to approximately 25, and M is tantalum, zirconium, chromium, or vanadium, and/or an alloy having the formula $Fe_{100-x}V_x$, where x is greater than or equal to approximately 10 and less than or equal to approximately 30; the iPMA layer is disposed between the layer of ferromagnetic material and the low saturation magnetization layer; the layer of ferromagnetic material is a first ferromagnetic layer, and the free region further comprises a second ferromagnetic layer; the free region further comprises an insertion layer comprising molybdenum, tungsten, tantalum, ruthenium, rhodium, rhenium, iridium, chromium, osmium, or a combination thereof; the fixed region is a first fixed region, and the magnetoresistive stack further comprising a spacer region including a second fixed region; a cap layer disposed between the free region and the spacer region, wherein the cap layer comprises magnesium oxide, aluminum oxide, or a combination thereof; and/or the iPMA layer is a first iPMA layer and the free region further comprises a second iPMA layer.

In another embodiment, a magnetoresistive stack is disclosed. The magnetoresistive stack includes a fixed region having a fixed magnetic state, a free region configured to have a first magnetic state and a second magnetic state, a dielectric layer disposed between the fixed region and the free region, and a cap layer in contact with the free region. The free region comprises a layer of ferromagnetic material and a low saturation magnetization layer. The cap layer comprises magnesium oxide, aluminum oxide, a metal oxide, or a combination thereof.

Various embodiments of the disclosed magnetoresistive stack may additionally or alternatively include one or more of the following features: low saturation magnetization layer comprises an alloy including nickel, iron, and boron, an alloy including cobalt, iron, boron, and at least one metal other than cobalt and iron, an alloy including iron and vanadium, and/or an alloy including gadolinium, iron, and cobalt; the free region further comprises an insertion layer comprising molybdenum, tungsten, tantalum, ruthenium, rhodium, rhenium, iridium, chromium, osmium, or a combination thereof; the free region further comprises an iPMA layer comprising a metal or a metal oxide; the iPMA layer comprises magnesium oxide, aluminum oxide, platinum, nickel, or a combination thereof; and/or the insertion layer is a first insertion layer, and the free region further comprises a second insertion layer.

The magnetoresistive stack includes a fixed region having a fixed magnetic state, a free region configured to have a first magnetic state and a second magnetic state, a dielectric layer disposed between the fixed region and the free region, and a cap layer in contact with the free region. The free region comprises an iPMA layer comprising magnesium oxide, aluminum oxide, platinum, nickel, or a combination thereof and a low saturation magnetization layer. The low saturation magnetization layer comprises an alloy including nickel, iron, and boron; an alloy including cobalt, iron, boron, and tantalum; an alloy including cobalt, iron, boron, and zirconium; an alloy including cobalt, iron, boron, and chromium; an alloy including iron and vanadium; and/or an alloy including gadolinium, iron, and cobalt. The cap layer comprises magnesium oxide, aluminum oxide, a metal oxide, or a combination thereof.

Various embodiments of the disclosed magnetoresistive stack may additionally or alternatively include one or more of the following features: the free region further comprises an insertion layer comprising molybdenum, tungsten, tantalum, ruthenium, rhodium, rhenium, iridium, chromium, osmium, or a combination thereof; the free region further comprises a first ferromagnetic layer and a second ferromagnetic layer; the first ferromagnetic layer is in contact with the dielectric layer; and/or the fixed region is a first fixed region, the magnetoresistive stack further comprises a spacer region above the cap layer, and the spacer region includes a second fixed region Although various embodiments of the present disclosure have been illustrated and described in detail, it will be readily apparent to those skilled in the art that various modifications may be made without departing from the present disclosure.

What is claimed is:

1. A magnetoresistive stack comprising:
a fixed region having a fixed magnetic state;
a free region configured to have a first magnetic state and a second magnetic state, and comprising:
a first layer of ferromagnetic material;
a second layer of ferromagnetic material;
a low saturation magnetization layer disposed above the first layer of ferromagnetic material and the second layer of ferromagnetic material; and
an interfacial perpendicular magnetic anisotropy (iPMA) layer comprising a metal, a metal oxide, or both, wherein the iPMA layer is disposed directly between the first layer of ferromagnetic material and the second layer of ferromagnetic material; and
a dielectric layer disposed between the fixed region and the free region, wherein a magnetic field is provided to the layers of the free region to set a preferred magnetic axis of the free region.

2. The magnetoresistive stack of claim 1, wherein the low saturation magnetization layer comprises:
an alloy including nickel, iron, and boron;
an alloy including cobalt, iron, boron, and tantalum;
an alloy including cobalt, iron, boron, and zirconium;
an alloy including cobalt, iron, boron, and chromium;
an alloy including iron and vanadium; and/or
an alloy including gadolinium, iron, and cobalt.

3. The magnetoresistive stack of claim 1, wherein the low saturation magnetization layer comprises:
an alloy having the formula $(Ni_{100-x}Fe_x)_{100-y}B_y$, where x is greater than or equal to approximately 50 and less than or equal to approximately 95, and y is greater than or equal to approximately 5 and less than or equal to approximately 30;
an alloy having the formula $(CoFe)_{100-x-y}M_xB_y$, where x is greater than or equal to approximately 10 and less than or equal to approximately 25, y is greater than or equal to approximately 15 and less than or equal to approximately 25, and M is tantalum, zirconium, chromium, or vanadium; and/or
an alloy having the formula $Fe_{100-x}V_x$, where x is greater than or equal to approximately 10 and less than or equal to approximately 30.

4. The magnetoresistive stack of claim 1, wherein the iPMA layer is disposed between the first layer of ferromagnetic material and the low saturation magnetization layer.

5. The magnetoresistive stack of claim 1, wherein the first layer of ferromagnetic material and the second layer of ferromagnetic material comprise a same ferromagnetic material.

6. The magnetoresistive stack of claim 1, wherein the free region further comprises an insertion layer comprising molybdenum, tungsten, tantalum, ruthenium, rhodium, rhenium, iridium, chromium, osmium, or a combination thereof.

7. The magnetoresistive stack of claim 1, wherein the fixed region is a first fixed region, and the magnetoresistive stack further comprising a spacer region including a second fixed region.

8. The magnetoresistive stack of claim 7, further comprising a cap layer disposed between the free region and the spacer region, wherein the cap layer comprises magnesium oxide, aluminum oxide, or a combination thereof.

9. The magnetoresistive stack of claim 1, wherein iPMA layer is a first iPMA layer and the free region further comprises a second iPMA layer.

10. A magnetoresistive stack comprising:

a fixed region having a fixed magnetic state;

a free region configured to have a first magnetic state and a second magnetic state, and comprising:

a first layer of ferromagnetic material;

a second layer of ferromagnetic material;

a low saturation magnetization layer disposed above the first layer of ferromagnetic material and the second layer of ferromagnetic material; and a first interfacial perpendicular magnetic anisotropy (iPMA) layer disposed between the first layer of ferromagnetic material and the second layer of ferromagnetic material; and a second iPMA layer separate from the first iPMA layer; and a dielectric layer disposed between the fixed region and the free region.

11. The magnetoresistive stack of claim 10, wherein the first iPMA layer comprises magnesium oxide, aluminum oxide, platinum, nickel, or a combination thereof.

12. The magnetoresistive stack of claim 10, wherein the second iPMA layer comprises magnesium oxide, aluminum oxide, platinum, nickel, or a combination thereof.

13. The magnetoresistive stack of claim 10, wherein the first layer of ferromagnetic material and the second layer of ferromagnetic material comprise a same ferromagnetic material.

14. The magnetoresistive stack of claim 10, wherein the second iPMA layer is spaced apart from the first iPMA layer by the low saturation magnetization layer.

15. The magnetoresistive stack of claim 10, wherein the free region has a preferred magnetization axis.

16. The magnetoresistive stack of claim 10, wherein the free region has a set magnetization axis induced by the first iPMA layer and the second iPMA layer.

17. A magnetoresistive stack comprising:

a fixed region having a fixed magnetic state;

a free region configured to have a variable magnetic state, the free region comprising:

a first layer of ferromagnetic material;

a second layer of ferromagnetic material;

a low saturation magnetization layer disposed above the first layer of ferromagnetic material and the second layer of ferromagnetic material; and an interfacial perpendicular magnetic anisotropy (iPMA) layer disposed between the first layer of ferromagnetic material and the second layer of ferromagnetic material and configured to induce a preferred magnetization axis of the free region; and a dielectric layer disposed between the fixed region and the free region.

18. The magnetoresistive stack of claim 17, wherein the iPMA layer comprises magnesium oxide, aluminum oxide, platinum, nickel, or a combination thereof.

19. The magnetoresistive stack of claim 17, wherein the iPMA layer is disposed between the first layer of ferromagnetic material and the low saturation magnetization layer.

20. The magnetoresistive stack of claim 17, further comprising a cap layer disposed between the free region and a spacer region, wherein the cap layer comprises magnesium oxide, aluminum oxide, or a combination thereof.

* * * * *